United States Patent
Frank (10) Patent No.: US 8,927,409 B2
(45) Date of Patent: Jan. 6, 2015

(54) HIGH-K TRANSISTORS WITH LOW THRESHOLD VOLTAGE

(71) Applicant: International Business Machines Corporation, Armonk, NY (US)

(72) Inventor: Martin M. Frank, Dobbs Ferry, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/046,218

(22) Filed: Oct. 4, 2013

(65) Prior Publication Data

US 2014/0038403 A1   Feb. 6, 2014

Related U.S. Application Data (63) Continuation of application No. 12/690,467, filed on Jan. 20, 2010, now Pat. No. 8,598,027.

(51) Int. Cl.

| | | |
|---|---|---|
| H01L 21/3205 | (2006.01) | |
| H01L 21/4763 | (2006.01) | |
| H01L 21/336 | (2006.01) | |
| H01L 21/8238 | (2006.01) | |
| H01L 21/28 | (2006.01) | |
| H01L 21/326 | (2006.01) | |
| H01L 29/51 | (2006.01) | |
| H01L 21/3105 | (2006.01) | |
| H01L 29/49 | (2006.01) | |

(52) U.S. Cl.
CPC .. *H01L 21/28247* (2013.01); *H01L 21/823842* (2013.01); *H01L 21/326* (2013.01); *H01L 29/517* (2013.01); *H01L 29/4966* (2013.01); *H01L 21/28088* (2013.01); *H01L 21/3105* (2013.01); *H01L 29/495* (2013.01); *H01L 21/2807* (2013.01); *H01L 21/28079* (2013.01); *H01L 21/28176* (2013.01)
USPC ............ 438/591; 438/287; 438/289; 438/770

(58) Field of Classification Search
USPC .................................. 438/287, 289, 591, 770
See application file for complete search history.

(56) References Cited

U.S. PATENT DOCUMENTS

| | | | |
|---|---|---|---|
| 6,991,972 B2 | 1/2006 | Lochtefeld et al. | |
| 7,091,135 B2 * | 8/2006 | Inumiya et al. | 438/758 |
| 7,115,461 B2 | 10/2006 | Anthony et al. | |
| 7,242,055 B2 | 7/2007 | Bojarczuk, Jr. et al. | |
| 7,342,421 B2 | 3/2008 | Berthold et al. | |
| 7,452,767 B2 | 11/2008 | Bojarczuk, Jr. et al. | |
| 7,477,541 B2 | 1/2009 | Abadeer et al. | |
| 7,504,700 B2 | 3/2009 | Zhu et al. | |

(Continued)

OTHER PUBLICATIONS

U.S. Appl. No. 12/690,467; Final Office Action; filed Jan. 20, 2010; Date Mailed: May 17, 2011; pp. 1-41.

(Continued)

*Primary Examiner* — Khiem D Nguyen
*Assistant Examiner* — Wilner Jean Baptiste
(74) *Attorney, Agent, or Firm* — Cantor Colburn LLP; Vazken Alexanian (57) ABSTRACT

An apparatus includes a wafer annealing tool and a plurality of electrodes coupled to the wafer annealing tool, wherein the electrodes are configured to be in physical contact with a wafer so that, when the wafer is annealed, a negative electrical bias is formed across one or more gate stacks of the wafer.

11 Claims, 6 Drawing Sheets

(56) References Cited

U.S. PATENT DOCUMENTS

| | | | |
|---|---|---|---|
| 7,511,341 | B2 | 3/2009 | Mouli |
| 2002/0036307 | A1 | 3/2002 | Song |
| 2003/0045080 | A1 | 3/2003 | Visokay et al. |
| 2004/0110337 | A1 | 6/2004 | King |
| 2004/0129674 | A1 | 7/2004 | Bease et al. |
| 2005/0173705 | A1 | 8/2005 | Kondo et al. |
| 2006/0081337 | A1 | 4/2006 | Himori et al. |
| 2006/0094176 | A1 | 5/2006 | Fehlhaber et al. |
| 2006/0163671 | A1 | 7/2006 | Gulari et al. |
| 2008/0142894 | A1 | 6/2008 | Vereecken et al. |
| 2008/0160462 | A1 | 7/2008 | Herchen et al. |
| 2008/0258198 | A1 | 10/2008 | Bojarczuk et al. |
| 2008/0303162 | A1 | 12/2008 | Ishida et al. |
| 2008/0311716 | A1* | 12/2008 | Chen ............................ 438/289 |
| 2009/0101989 | A1 | 4/2009 | Chen et al. |
| 2009/0170339 | A1 | 7/2009 | Trentzsch et al. |
| 2010/0078334 | A1 | 4/2010 | Woodruff et al. |
| 2011/0175147 | A1 | 7/2011 | Adusumilli et al. |

OTHER PUBLICATIONS

U.S. Appl. No. 12/690,467; Non-Final Office Action; filed Jan. 20, 2010; Date Mailed: Nov. 23, 2012; pp. 1-19.

U.S. Appl. No. 12/690,467; Non-Final Office Action; filed Jan. 20, 2010; Date Mailed: May 4, 2012; pp. 1-17.

E.P. Gusev et al.; "Advanced high-k dielectirc stacks with polySi and metal gates: Recent progress and current challenges;" IBM J. Res. & Dev., vol. 50, No. 4/5; Jul./ Sep. 2006; pp. 387-409.

U.S. Appl. No. 13/442,087; Notice of Allowance; filed Apr. 9, 2012; Date Mailed: May 14, 2013; pp. 1-18.

U.S. Appl. No. 13/442,090; Non-Final Office Action; filed Apr. 9, 2012; Date Mailed: May 7, 2013; pp. 1-14.

Y. Akasaka, et al."Modified Oxygen Vacancy Induced Fermi Level Pinning Model Extendable to P-Metal Pinning," Japanese Journal of Applied Physics, pp. L1289-L1298, vol. 45, No. 49, 2006.

PK Chaudhari, "Low Temperature Anneal to Enhance Yield and Reliability Improvement by Elimination Parametric Defradation," IP.com, Mar. 2005, pp. 4622-4623, IBM.

E. Cho, et al., "Segregation of Oxygen Vacancy at Metal-HF02 Interfaces," Applied Physics Letters, pp. 233118-1 to 233118-3, 2008.

U.S. Appl. No. 13/442,087; Non-Final Office Action; filed Apr. 9, 2012; Date Mailed: Nov. 13, 2012; pp. 1-26.

Jae-Hong Jeon, et al.,"Effects of Gate Bias Stress on the Electrical Characteristics of ZnO Thin Film Transistor," Journal of the Korean Physical Society, vol. 53, No. 1, pp. 412-415, Jul. 2008.

S. Mahapatra, et al., "Investigation and Modeling of Interface and Bulk Trap Generation During Negative Bias Temperature Instability of p-MOSFETS," IEEE Transacations on Electron Devices, pp. 1371-1379, vol. 51, No. 9, 2004.

I Manic, et al., "Effects of Low Gate Bias Annealing in NBT Stressed p-channel power VDMOSFETS," Microelectronics Reliability, pp. 1003-1007, 49, Jul. 2009.

U.S. Appl. No. 13/442,090; Non-Final Office Action; filed Apr. 9, 2012; Date Mailed: Nov. 13, 2012; pp. 1-18.

J. Robertson, et al, "Fermi Level Pinning by Defects in HfO2-Metal Gate Stacks," Applied Physics Letters, pp. 132912-1 to 132912-3; 2007.

N. Umezawa, et al., "Suppression of Oxygen Vacancy formation in HF-based high-k dielectrics by lanthanum Incorporation," Applied Physics Letters, pp. 132901-1 to 132904-3, 91, 2007.

* cited by examiner

HIGH-K TRANSISTORS WITH LOW THRESHOLD VOLTAGE

CROSS-REFERENCE TO RELATED APPLICATION

This application is a continuation of U.S. patent application Ser. No. 12/690,467, filed Jan. 20, 2010, now U.S. Pat. No. 8,598,027, the disclosure of which is incorporated by reference herein in its entirety.

BACKGROUND

The invention relates generally to semiconductor devices, and more particularly to high-k transistors with low threshold voltage, and methods for making the same.

Scaling of the gate dielectric (or gate insulator) is a challenge in improving performance of advanced field effect transistors (FETs). A gate dielectric with equivalent oxide thickness (EOT) of around 1 nm is desired for some FETs, e.g., in 45 nm technology. In a FET employing a silicon oxide based gate dielectric (e.g., $SiO_2$), the leakage current through the gate dielectric increases exponentially with the decrease in the thickness of the gate dielectric. When the thickness of a silicon oxide based gate dielectric is at or below about 1 to 2 nm, the gate leakage current typically becomes too high, resulting in higher power consumption than is acceptable for a given application. High-dielectric-constant (high-k) gate dielectrics provide a way of scaling down the thickness of gate dielectrics without an excessive increase in gate leakage current. Hafnium based materials are candidates for gate dielectric materials. However, studies have revealed an undesirably high threshold voltage (Vt) in the case of p-channel metal oxide semiconductor field effect transistors (MOSFETs) having hafnium based high-k dielectrics on silicon based channels.

SUMMARY

In exemplary embodiment, an apparatus includes a wafer annealing tool and a plurality of electrodes coupled to the wafer annealing tool, wherein the electrodes are configured to be in physical contact with a wafer so that, when the wafer is annealed, a negative electrical bias is formed across one or more gate stacks of the wafer.

It is noted that the drawings of the disclosure are not to scale. The drawings are intended to depict only typical aspects of the disclosure, and therefore should not be considered as limiting the scope of the disclosure. In the drawings, like-numbering represents like-elements when comparing between drawings.

DETAILED DESCRIPTION

This invention relates generally to semiconductor devices, and more particularly to high-k transistors with low threshold voltage, and methods for making the same. As field effect transistors become smaller and smaller, ways of decreasing the thickness of the gate dielectric are being investigated. Thin high-k dielectrics, such as those based on hafnium or zirconium, can be used to reduce gate leakage current compared to SiON gate dielectrics with comparable gate stack capacitance. However, a high-k dielectric on a silicon-based channel can result in a threshold voltage (Vt) that is higher than desired for certain applications. In some cases, a p-channel FET (pFET) having a hafnium- or zirconium-based high-k gate dielectric on a silicon-based channel can have a Vt that is 0.5-0.6 V higher than desired.

A factor contributing to this higher Vt is the formation of oxygen vacancies (Vo) in a high-k dielectric in the presence of a gate electrode with a sufficiently high workfunction, particularly during dopant activation anneal. As an example, generally at temperatures relevant for chip processing, the volume density of Vo in HfO2 or HfSiON is small, although not zero, because the required energy input for Vo formation in the HfO2 or HfSiON in contact with an ultra-high vacuum environment is large. However, when HfO2 or HfSiON is near a silicon channel and a gate electrode with a sufficiently high workfunction (typically ca. 4.5-5.1 eV), two processes reduce (and may even make negative) the required energy input for Vo formation. The first is oxygen transfer from the HfO2 or HfSiON to the Si substrate, oxidizing the substrate. This can occur even when a SiO2 interfacial layer is present between the HfO2 or HfSiON layer and the Si substrate. The second is subsequent electron transfer from the HfO2 or HfSiON to the gate electrode. As a consequence of these processes, more oxygen vacancies exist in the HfO2 or HfSiON than would otherwise exist. These oxygen vacancies can be doubly positively charged so that the dielectric has a net positive charge, thereby shifting device characteristics such as the threshold voltage (Vt) and the flatband voltage (Vfb) towards more negative values.

Embodiments of this invention provide a method for inhibiting (i.e., reducing or preventing an increase in, although perhaps not eliminating) formation of oxygen vacancies in a high-k dielectric layer (e.g., a hafnium- or zirconium-based dielectric layer) disposed subjacent to a gate electrode by applying, during an anneal in excess of 350° C., a negative electrical bias to the gate electrode formed over the high-k dielectric layer. In one exemplary embodiment, this method is part of a method for forming a p-channel FET. The magnitude of the bias depends on the choice of gate stack materials. In an exemplary embodiment, the magnitude of the bias is from about −0.1 V and about −2 V. In an exemplary embodiment, the anneal in excess of 350° C. is an activation anneal, such as a dopant activation anneal approximately 1000° C. or higher. By applying this negative bias to the gate electrode during the an anneal in excess of 350° C., the Fermi level of the gate electrode is increased with respect to the oxygen vacancy level in the high-k dielectric during the anneal. This reduces, and sometimes can eliminate, the energy gain from electron transfer from the high-k dielectric to the gate electrode, thereby reducing, and sometimes eliminating, one thermodynamic driving force for oxygen vacancy formation. The density of the oxygen vacancies, and thereby the density of the positive charge, after activation anneal is reduced and a less negative threshold voltage (i.e. a threshold voltage with a lower absolute value) of the p-channel FET may be achieved.

Figure 1:
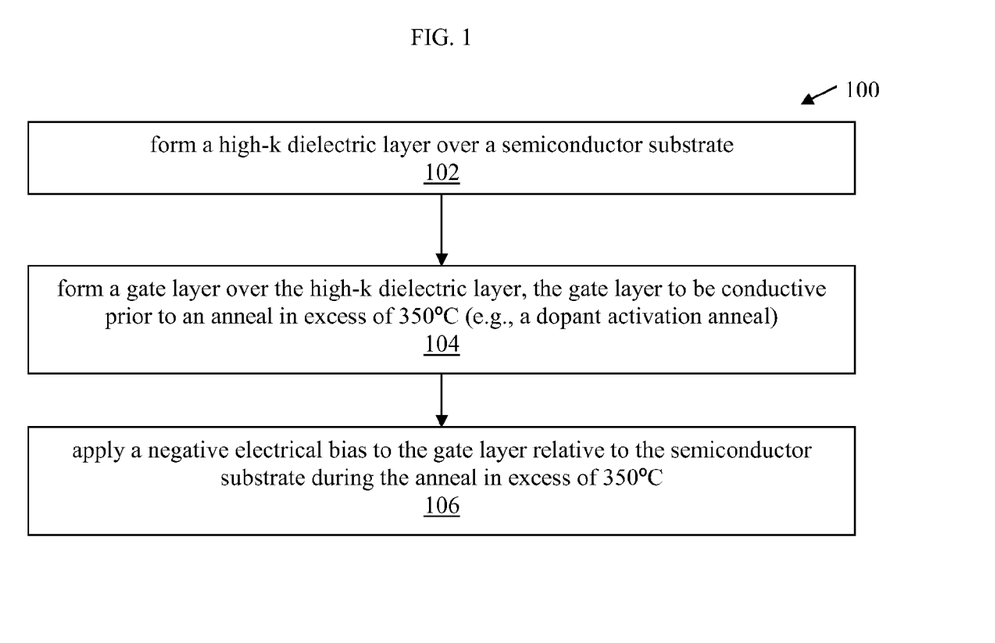
FIG. 1 is a flow diagram of a method in accordance with one embodiment of this invention.

FIG. 1 is a flow diagram of a method 100 in accordance with one embodiment of this invention. At 102, a high-k dielectric layer is formed over a semiconductor substrate. The high-k dielectric may include hafnium or zirconium. For example, in certain embodiments, the high-k dielectric layer is composed essentially of $HfO_2$, HfON, HfSiO, or HfSiON. The semiconductor substrate may be a silicon substrate such as a bulk silicon wafer, for example. In one embodiment, the semiconductor substrate is a silicon-on-insulator (SOI) wafer. The high-k dielectric layer may be formed over a semiconductor substrate using techniques such as chemical vapor deposition (CVD). Other formation techniques are identified later in this disclosure.

At 104, a gate layer is formed over the high-k dielectric layer (e.g., by CVD). The gate layer is to be conductive prior to an anneal (such as an activation anneal) in excess of 350° C. By being conductive prior to anneal, the Fermi level in the gate layer may be controlled by an external bias during an entire anneal sequence if desired.

In one embodiment, the gate layer is composed essentially of or includes a material that is essentially nonconductive during its formation over the high-k dielectric layer, but becomes conductive during ramp-up to an activation anneal temperature. For example, the gate layer may be composed of or include a material which, when deposited at a temperature of less than 500° C., is essentially non-conductive, but becomes conductive during ramp-up (e.g., at around 500° C.), prior to a dopant activation anneal at approximately 1000° C. This material may be, for example, an in-situ boron-doped polycrystalline silicon germanium (poly-SiGe). Poly-SiGe can be activated at temperatures as low as 525° C. Poly-SiGe can also serve as an oxygen barrier layer, inhibiting oxygen ingress and oxidation of the channel during the activation anneal. Accordingly, in one embodiment, forming the gate layer over the high-k dielectric layer includes forming an in-situ boron-doped polycrystalline silicon germanium (poly-SiGe) layer over the high-k dielectric layer. In one embodiment, the in-situ boron-doped polycrystalline poly-SiGe is formed on a thin metal gate formed over the high-k dielectric layer.

In one embodiment, the gate layer is composed essentially of or includes a material that is conductive before temperature ramp-up to the anneal. This material may be, for example, a metal that is conductive during its formation over the high-k dielectric layer. The metal may be a low-resistivity metal. In one embodiment, the metal is composed essentially of tungsten. Accordingly, in one embodiment, forming the gate layer over the high-k dielectric layer may include forming (e.g., by CVD) a metal layer over the high-k dielectric layer.

In one embodiment, forming the metal layer over the high-k dielectric layer includes first forming an oxygen barrier metal layer over the high-k dielectric layer and then forming the low-resistivity metal layer over the oxygen barrier metal layer. As described in further detail in U.S. Ser. No. 12/690,178, this oxygen barrier layer can help prevent oxygen ingress and oxidation of a silicon channel during an activation anneal, as well as maximize gate stack capacitance of the finished device.

Accordingly, embodiments include forming a gate layer which is either conductive or non-conductive at formation. This gate layer is formed over a high-k dielectric layer. This gate layer is heated to 350° C., e.g., during temperature ramp-up to an anneal such that, if the gate layer was non-conductive at formation, the gate layer becomes conductive prior to anneal.

Figure 2:
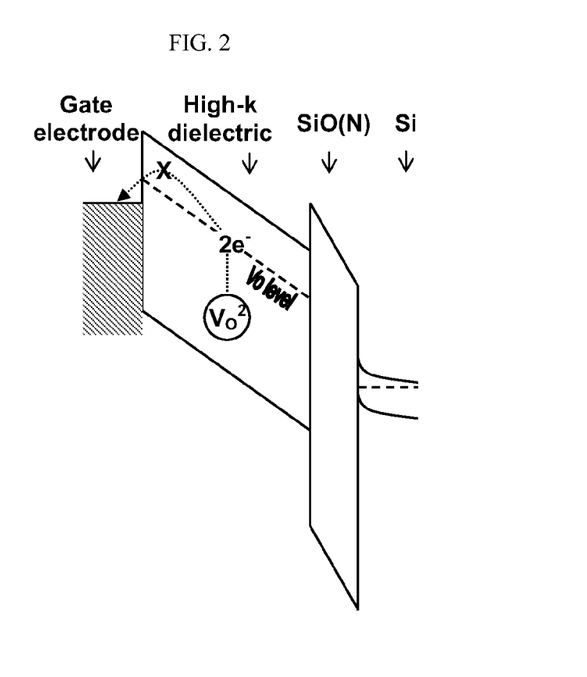
FIG. 2 is an illustration of applying the negative electric bias to the gate layer in accordance with embodiments of this invention.

At 106, a negative electrical bias is applied to the gate layer relative to the semiconductor substrate during the anneal in excess of 350° C. The magnitude of the electrical bias depends on the choice of gate stack materials. In an exemplary embodiment, the electrical bias is from about −0.1 V and about −2 V. FIG. 2 is an illustration of applying the negative electric bias to the gate layer in accordance with embodiments of this invention. As illustrated in the exemplary embodiment shown FIG. 2, by applying a negative electric bias to the gate layer, the Fermi level of the gate layer is raised with respect to the Si channel and oxygen vacancy level in the high-k dielectric during the anneal. This makes electron transfer from oxygen vacancies within the high-k dielectric to the gate layer more energetically costly, thereby reducing the number of Vo that would otherwise form in the high-k dielectric.

Figure 3:
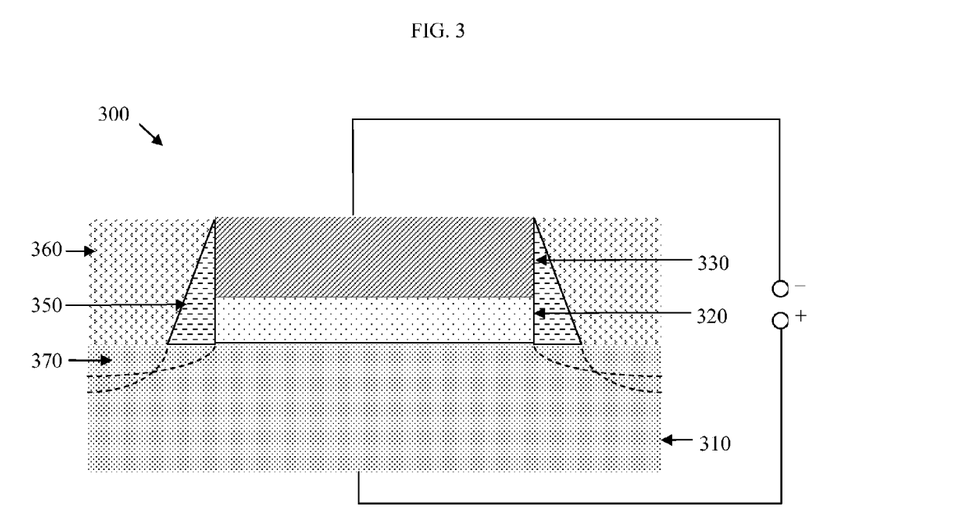
FIG. 3 is schematic illustration of a semiconductor structure in accordance with one exemplary embodiment of the invention.

FIG. 3 is schematic illustration of a semiconductor structure 300 in accordance with one exemplary embodiment of the invention. Semiconductor structure 300 includes a semiconductor substrate 310, a high-k dielectric layer 320, and a gate layer 330. The high-k dielectric layer 320 is disposed over the substrate 310. The gate layer 330 is disposed over the high-k dielectric layer 320. The substrate 310 may be a bulk n-Si or p-Si wafer, for example. In one embodiment, the high-k dielectric layer 320 is composed essentially of $HfO_2$, HfON, HfSiO, or HfSiON. In one embodiment, the gate layer 330 is a metal layer, e.g., a low-resistivity metal layer composed essentially of tungsten or other elemental metals or metallic compounds. In some embodiments, the gate layer essentially forms a pure metal gate electrode. In some embodiments, the gate layer forms a poly-Si gate electrode. In some embodiments, the gate layer is in-situ boron-doped polycrystalline silicon germanium (poly-SiGe) formed on a thin metal gate. The gate layer 330 is conductive prior to an anneal, e.g., an anneal in excess of 350° C., and has a negative electric bias during the anneal. FIG. 3 depicts structure 300 both prior to in preparation for and during the anneal. Also shown in FIG. 3 are spacers 350, insulating material 360, and dopants 370. The spacers 350 may be composed of Si3N4, for example, and the insulating material may be composed of SiO2. In one exemplary embodiment, the device in FIG. 3 is a p-channel FET and the dopants are p-type dopants, e.g., boron or aluminum.

In many circumstances, more than one high-k gate stacks are disposed on the same substrate. In some applications, it may be desirable to apply the negative electric bias during a dopant activation anneal to some, but not all, of the high-k gate stacks on a substrate or in a circuit. This can occur, for example, when pFET devices for different applications having different threshold voltage requirements are located on the same substrate. This can also occur, for example, when pFET and nFET devices are being formed on the same substrate, e.g., to form CMOS devices. It may be desirable for method 100 to be part of the method for forming the p-channel device, but not part of the method for forming the n-channel device.

For such applications, embodiments of the invention further include patterning the high-k dielectric layer and gate layer to form a plurality of devices on the substrate (e.g., a plurality of pFET high-k gate stacks); forming an insulating layer electrically isolating the plurality of devices from each other; forming a metal layer over the insulating layer electrically connecting certain of the plurality of devices to each other; and applying a negative voltage across the metal layer and the substrate during an anneal in excess of 350° C. to simultaneously create a negative electrical bias across the gate layer of each of the certain plurality of devices. This is further illustrated in FIG. 4.

Figure 4:
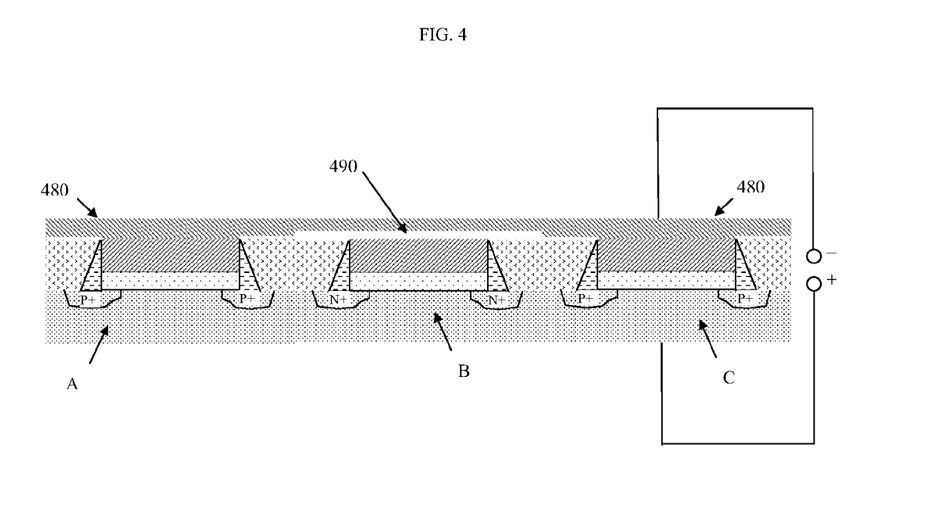
FIG. 4 is an illustration of a plurality of devices in accordance with embodiments of this invention.

FIG. 4 is an illustration of a plurality of devices in accordance with embodiments of this invention. FIG. 4 shows a p-channel device A, an n-channel device B, and a p-channel device C. A metal layer 480 is disposed over the two p-channel devices A and C and an insulating layer 490 is disposed over n-channel device B.

The insulating layer electrically isolates the plurality of devices from each other. The insulating layer 490 may be formed, for example, by depositing an insulating material, e.g., SiO2, to form a blanket insulating layer over the three devices. The insulating layer then may be patterned to expose the top surface of certain of the plurality of devices, e.g., to expose the gate layer of p-channel devices A and C but not expose the gate layer of n-channel device B.

A metal layer can be formed over the insulating layer to electrically connect those certain plurality of devices to each other. For example, a low-resistivity metal (e.g., tungsten or aluminum) may be depositing on the exposed gate layer of device A and device C to form metal layer 480, electrically connecting device A to device C. The metal layer 480 may be composed of or include the same material as a gate electrode, e.g., gate layer 330. For example, in one embodiment, the metal layer 480 and the gate layer 330 are both composed essentially of tungsten. In other embodiments, the metal layer 480 is composed essentially of a material different than that gate layer 330. For example, metal layer 480 may be composed of aluminum or copper while gate layer 330 is composed of essentially of tungsten.

As shown in FIG. 4, a negative voltage is applied across the metal layer and the substrate. Since the metal layer 480 electrically connects devices A and C, but not device B, a negative electrical bias can be applied simultaneously to the gate electrodes of device A and C without being applied to the gate electrode of device B.

Figure 5:
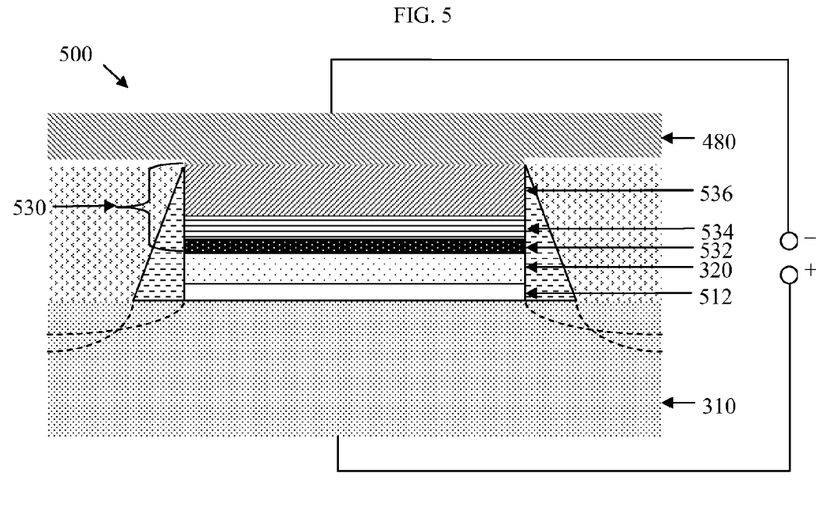
FIG. 5 is schematic illustration of a semiconductor structure in accordance with another exemplary embodiment of the invention.

FIG. 5 is schematic illustration of a semiconductor structure in accordance with another exemplary embodiment of the invention. Semiconductor structure 500 includes a semiconductor substrate 310, a high-k dielectric layer 320, and a gate layer 530. The high-k dielectric layer 320 is disposed over the substrate 310. The gate layer 530 is disposed over the high-k dielectric layer 320. The gate layer 530 includes a metal layer 532, an oxygen barrier metal layer 534, and a metal layer 536. The oxygen barrier metal layer 534 is disposed over the high-k dielectric layer 520, on the optional metal layer 532. The metal layer 536 is disposed on the oxygen barrier metal layer 534.

The metal layer 532 is composed of a conducting material, e.g. a conducting nitride. In one exemplary embodiment, the metal layer 532 is composed essentially of TiN. In other embodiments, the metal layer 532 is composed essentially of TaN, TiSiN, or TaSiN. The oxygen barrier metal layer 534 is composed of a conducting compound material that helps prevent or reduce oxygen diffusion from the low-resistivity metal to the underlying layers and the channel during activation anneal. In one embodiment, the oxygen barrier metal layer 534 is composed essentially of TiAlN or TaAlN. The oxygen barrier metal layer 534 can serve as the workfunction metal in certain applications. In such applications, metal layer 532 may not be part of the structure. The metal layer 536 is composed of the same material as layer 330. For example, in one exemplary embodiment, the metal layer 532 is a low-resistivity metal layer composed essentially of tungsten. As shown in FIG. 5, the metal layer 536 is subjected to a negative electrical bias during anneal.

Structure 500 also includes an interfacial layer (IL) 512 disposed between the substrate layer 510 and the high-k dielectric 320. The interfacial layer 512 may be formed on the substrate prior to deposition of the high-k dielectric layer. For example, the interfacial layer 512 may be SiO2 or SiON formed on an exposed bulk Si substrate.

Figure 6:
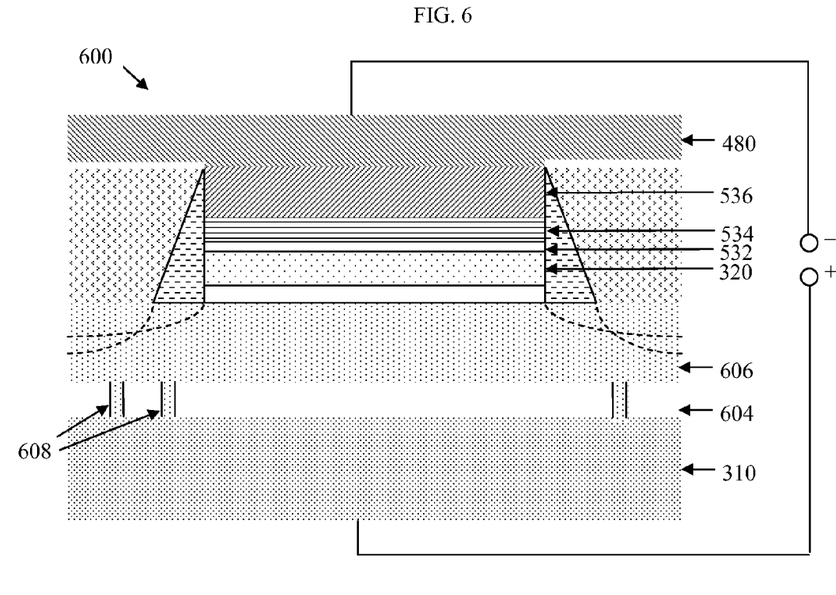
FIG. 6 is schematic illustration of a semiconductor structure in accordance with another exemplary embodiment of the invention.

FIG. 6 is schematic illustration of a semiconductor structure in accordance with another exemplary embodiment of the invention. In FIG. 6, semiconductor structure 600 includes a high-k dielectric layer 320 disposed over a substrate 310, and a gate electrode 536 disposed over the high-k dielectric layer 320. Semiconductor structure 600 also includes a buried oxide layer 604, an active layer 606, and body contacts 608. The buried oxide layer 604 is disposed over the substrate (e.g., a bulk silicon layer), the active silicon layer 606 is disposed over the buried oxide layer 604, and the body contacts 608 are disposed through the buried oxide layer. The body contacts 608 electrically connect the active layer 606 to the bulk silicon layer.

In one embodiment, layer 604 and 606 and contacts 608 are formed by depositing an oxide material, such as SiO2, on substrate 310 to form an oxide layer 604. Vias are then etched through the oxide layer 604, and filled with a conductive material to form the body contacts. A conductive material is then deposited on the oxide layer and the body contacts to form layer 606.

In one embodiment, the body contacts and the active layer 606 are composed of the same material (e.g. silicon) and are formed as part of the same deposition process. In other embodiments, the body contacts and the active layer 606 are composed a different material. For example, the body contacts may be composed essentially of tungsten while the active layer is composed essentially of silicon. In such embodiments, the body contacts are formed first, such as by depositing tungsten to fill the vias. The top surface of the body contacts and oxide layer 604 may be planarized. Layer 606 is formed on the oxide layer and body contacts, such as by depositing silicon. Accordingly, the body contacts 608 electrically connect the active layer 606 to the bulk silicon layer. The high-k gate dielectric and gate stack are then formed over the active layer as described elsewhere in this disclosure. As shown in FIG. 6, a negative electrical bias is applied across the gate layer and the silicon-on-insulator substrate through the body contacts.

Figure 7:
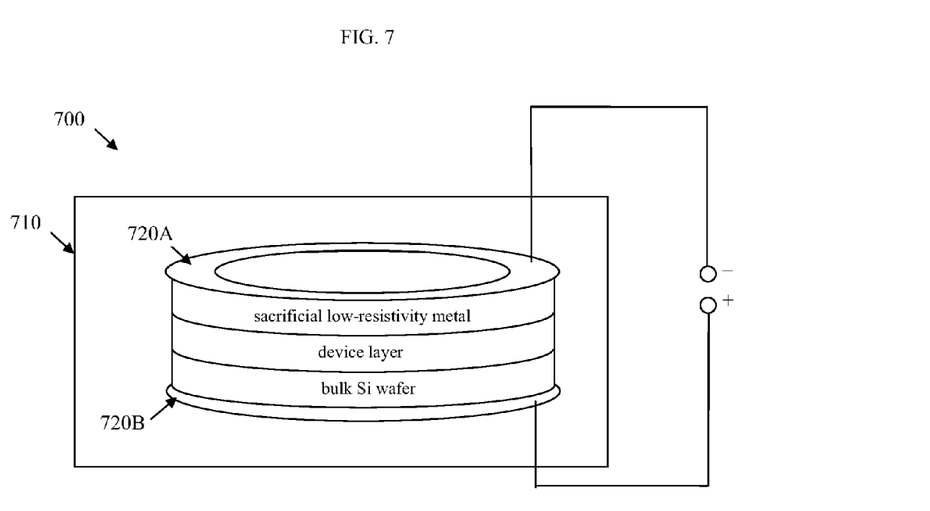
FIG. 7 is a schematic illustration of an apparatus for applying an electrical bias during an anneal in accordance with one embodiment of this invention.

FIG. 7 is a schematic illustration of an apparatus 700 for applying an electrical bias during an anneal in accordance with one embodiment of this invention. The apparatus includes a wafer annealing tool 710 and electrodes 720A and 720B coupled to the wafer annealing tool.

The electrodes are configured to be in physical contact with a wafer. In the embodiment shown in FIG. 7, electrode 720A is configured to be in physical contact with a front side of the wafer and electrode 720B is configured to be in physical contact with a back side of the wafer. For example, the electrodes may be aligned above and below the front and back side of the wafer, respectively. The apparatus may then operate by pressing electrode 720A against the front side of the wafer and electrode 720B against the back side of the wafer simultaneously. The electrodes are also configured to form, during an anneal (e.g., an activation anneal) in excess of 350° C., a negative electrical bias across one or more gate stacks of the wafer. The negative electrical bias formed across the one or more gate stacks may be from about −0.1 V and about −2 V, for example.

In an exemplary embodiment, the electrodes are each shaped substantially like a ring. Such a shape provides for access to a majority of the wafer front and back surfaces for the light used for wafer heating, and for the pyrometer used for wafer temperature measurement. In other embodiments, the electrodes are other shapes.

Figure 8:
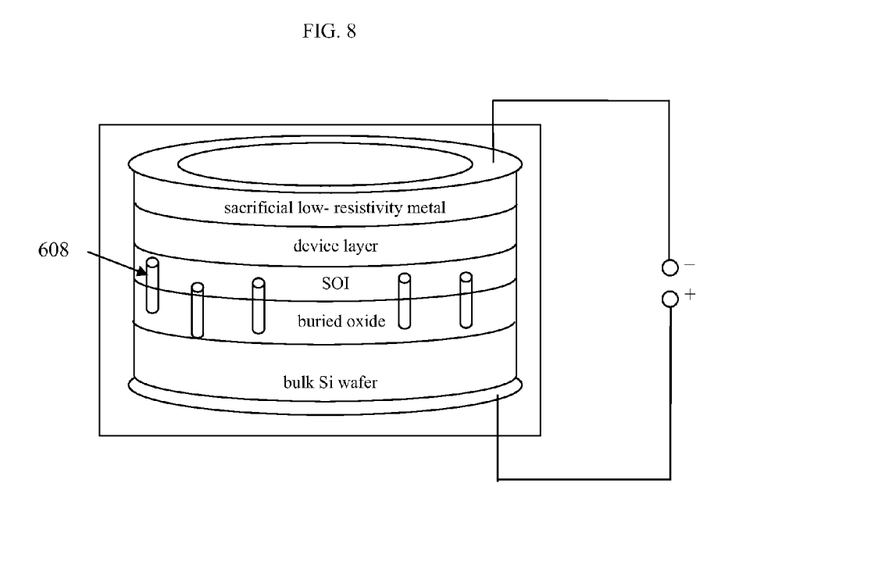
FIGS. 8 and 9 illustrate application of a negative gate bias across devices fabricated on SOI wafers in accordance with embodiments of this invention.
Figure 9:
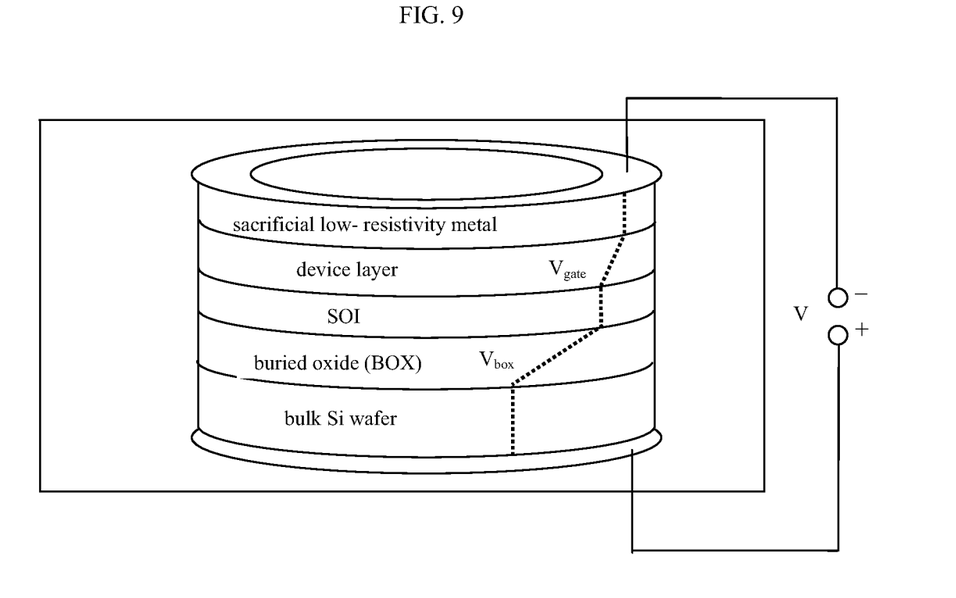

FIGS. 8 and 9 illustrate application of a negative gate bias across devices fabricated on SOI wafers, e.g., for CMOS technologies, in accordance with embodiments of this invention. In FIG. 8, the SOI wafer was fabricated with body contacts 608, as described earlier in this disclosure. The body contacts connect the active area of the devices (e.g., p-channel transistors) to the back of the wafer. In FIG. 9, the SOI wafer was not fabricated with body contacts. In such an embodiment, a higher voltage may be applied between the front side of the SOI wafer and the back side of the SOI wafer than would be applied if the wafer was a bulk silicon wafer, or an SOI wafer having body contacts. The higher voltage adjusts for the additional voltage drop across the buried oxide (BOX) layer within the wafer, as shown by the dotted line in FIG. 9.

In one embodiment, the apparatus also includes a controller (not shown) coupled to the electrodes. The controller is configured to select a target negative electrical bias based on a material of the gate stack and control the electrodes into creating, during activation annealing, the target negative electrical bias across the one or more gate stacks of the wafer. In one embodiment, the controller is configured to control the electrodes into applying a higher voltage between a front side of the wafer and a back side of the wafer when the wafer is a silicon-on-insulator wafer than when the wafer is a bulk silicon wafer.

Thus, structures and methods of making semiconductor devices, and more particularly, high-k transistors with low threshold voltage, are disclosed. Although the figures and descriptions have details relating to bulk wafers, it shall be appreciated that the same methodology may be applied to other semiconductor designs.

Embodiments of this invention provide a method for forming a semiconductor structure. The method includes forming a high-k dielectric layer over a semiconductor substrate and forming a gate layer over the high-k dielectric layer. The gate layer includes a material selected from the group consisting of: a conductive material, a non-conductive material, or a combination thereof. The method also includes heating the gate layer to 350° C., wherein, if the gate layer includes the non-conductive material, the non-conductive material becomes conductive. The method further includes annealing the substrate, the high-k dielectric layer, and the gate layer in excess of 350° C., and during the annealing, applying a negative electrical bias to the gate layer relative to the semiconductor substrate. The annealing in excess of 350° C. may be an activation annealing. The electrical bias may be from about −0.1 V and about −2 V.

Embodiments of this invention also provide a semiconductor structure. The semiconductor structure includes a high-k dielectric layer over a semiconductor substrate; and a gate layer over the high-k dielectric layer. The gate layer has a negative electrical bias during anneal. Embodiments of the invention provide a p-channel FET (pFET) that includes this structure. The high-k dielectric layer may include hafnium or zirconium. For example, the high-k dielectric layer may include hafnium oxide ($HfO_2$), hafnium oxynitride (HfON), hafnium silicate (HfSiO), hafnium silicon oxynitride (HfSiON), or hafnium zirconate (HfZrO). The gate layer of the structure may further include an oxygen barrier metal layer over the high-k dielectric layer; and a low-resistivity metal layer on the oxygen barrier metal layer, for example. The oxygen barrier metal layer may be composed essentially of TiAlN or TaAlN, for example. The low-resistivity metal layer may be composed essentially of tungsten, for example. The gate layer may include in-situ boron-doped polycrystalline silicon germanium, for example.

Embodiments of the invention further provide a method for inhibiting formation of oxygen vacancies in a hafnium- or zirconium-based dielectric layer disposed subjacent to a gate electrode, the method including, during an anneal in excess of 350° C., applying a negative electrical bias to said gate electrode formed over said hafnium- or zirconium-based dielectric layer. Embodiments of the invention provide a method for forming a p-channel FET including this method.

Embodiments of the invention further provide an apparatus. The apparatus includes a wafer annealing tool and a plurality of electrodes coupled to the wafer annealing tool. The plurality of electrodes are configured to be in physically contact with a wafer so that, when the wafer is annealed, a negative electrical bias is formed across one or more gate stacks of the wafer. The plurality of electrodes may include a first ring electrode configured to be in contact with a front side of the wafer; and a second ring electrode configured to be in contact with a back side of the wafer. The electrodes may be configured to create, during activation annealing, a negative electrical bias from about −0.1 V and about −2 V across the one or more gate stacks. The apparatus may also include a controller coupled to the electrodes. The controller is configured to select a target negative electrical bias based on a material of the gate stack and control the electrodes into forming, during activation annealing, the target negative electrical bias across the one or more gate stacks of the wafer. The controller may be configured to control the electrodes into applying a higher voltage between a front side of the wafer and a back side of the wafer when the wafer is a silicon-on-insulator wafer than when the wafer is a bulk silicon wafer.

Embodiments of the invention further provide a method for inhibiting formation of oxygen vacancies in a high-k dielectric layer disposed subjacent to one or more gate stacks of a wafer. The method includes bringing a first electrode into contact with a front side of a wafer, and bringing a second electrode into contact with a back side of the wafer. The method also includes annealing the wafer in excess of 350° C. The method further includes, during the annealing, applying a negative electrical bias to one or more gate stacks of the wafer via the electrodes. The first and second electrodes may be each substantially ring-shaped.

The term high-k dielectric refers to a material with a high dielectric constant (k) relative to silicon dioxide. A high-k dielectric layer may include, for example, hafnium or zirconium. High-k dielectric as used herein may include any now known or later developed high-k dielectric (k equal to or >3.9) material such as hafnium silicate ($HfSiO_x$), hafnium oxide ($HfO_2$), lanthanum oxide ($LaO_2$), zirconium silicate ($ZrSiO_x$), zirconium oxide($ZrO_2$), silicon oxide ($SiO_2$), silicon nitride ($Si_3N_4$), silicon oxynitride (SiON), high-k material or any combination of these materials.

Forming as used herein may include any appropriate depositing technique(s) appropriate for the material to be deposited including but not limited to: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

In exemplary embodiments described above, the anneal during which the negative bias is applied is an activation anneal, e.g., an anneal used during a dopant activation stage of device fabrication. In other embodiments, the anneal may occur during other stages of the fabrication, e.g., during the 'middle-of-the-line' (MOL) or 'back-end' (BEOL) fabrication sequence. The anneal may be, but is not limited to, a rapid thermal anneal (RTA), flash anneal, or laser anneal.

The methods as described above are used in the fabrication of integrated circuit chips. The resulting integrated circuit chips can be distributed by the fabricator in raw wafer form (that is, a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing drawings show some of the processing associated according to several embodiments of this disclosure. In this regard, each drawing or block within a flow diagram of the drawings represents a process associated with embodiments of the method described. Also, one of ordinary skill in the art will recognize that additional blocks that describe the processing may be added.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Further, references to "a method" or "an embodiment" throughout are not intended to mean the same method or same embodiment, unless the context clearly indicates otherwise.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

The invention claimed is:

1. A method for forming a semiconductor structure, the method comprising:
    forming a high-k dielectric layer over a semiconductor substrate;
    forming a gate layer over the high-k dielectric layer, wherein the gate layer initially comprises a material selected from the group consisting of: a conductive material, a non-conductive material, and a combination thereof;
    heating the gate layer to 350° C., wherein, if the gate layer initially includes the non-conductive material, the non-conductive material becomes conductive as a result of the heating of the gate layer to 350° C.;
    following the heating the gate layer to 350° C., annealing the substrate, the high-k dielectric layer, and the gate layer at a temperature in excess of 350° C.; and
    during the annealing, applying a negative electrical bias to the gate layer relative to the semiconductor substrate.

2. The method of claim 1, wherein the annealing is an activation annealing.

3. The method of claim 1, wherein the high-k dielectric layer comprises hafnium or zirconium.

4. The method of claim 1, wherein the high-k dielectric layer comprises a material selected from the group consisting of $HfO_2$, HfON, HfSiO, and HfSiON.

5. The method of claim 1, wherein the electrical bias is from about −0.1 V to about −2 V.

6. The method of claim 1, wherein forming the gate layer over the high-k dielectric layer comprises:
    forming a metal layer over the high-k dielectric layer.

7. The method of claim 6, wherein the metal layer is a low-resistivity metal layer.

8. The method of claim 7, further comprising:
    disposing an oxygen barrier metal layer between the high-k dielectric layer and the low-resistivity metal layer.

9. The method of claim 1, wherein forming the gate layer over the high-k dielectric layer comprises: forming an in-situ boron-doped polycrystalline silicon germanium layer over the high-k dielectric layer.

10. A method for inhibiting formation of oxygen vacancies in a hafnium- or zirconium-based dielectric layer disposed subjacent to a gate electrode, during the formation of a semiconductor structure, the method comprising, during an anneal in excess of 350° C., applying a negative electrical bias, relative to a substrate, to said gate electrode formed over said hafnium- or zirconium-based dielectric layer.

11. A method for forming a p-channel FET comprising the method of claim 10.

* * * * *